(12) United States Patent
Tiller et al.

(10) Patent No.: US 7,718,045 B2
(45) Date of Patent: May 18, 2010

(54) GROUND SHIELD WITH REENTRANT FEATURE

(75) Inventors: Jennifer W. Tiller, Waconia, MN (US); Anantha Subramani, San Jose, CA (US); Michael S. Cox, Santa Clara, CA (US); Keith A. Miller, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 914 days.

(21) Appl. No.: 11/426,775

(22) Filed: Jun. 27, 2006

(65) Prior Publication Data

US 2007/0295602 A1 Dec. 27, 2007

(51) Int. Cl.
C23C 14/34 (2006.01)
(52) U.S. Cl. ................................. 204/298.11
(58) Field of Classification Search ............ 204/298.11; 118/720
See application file for complete search history.

(56) References Cited

U.S. PATENT DOCUMENTS

| 5,202,008 | A | * | 4/1993 | Talieh et al. | 204/192.32 |
| 5,755,936 | A | | 5/1998 | Raaijmakers | |
| 5,824,197 | A | * | 10/1998 | Tanaka | 204/192.12 |
| 5,885,428 | A | | 3/1999 | Kogan | |
| 6,149,784 | A | * | 11/2000 | Su et al. | 204/298.11 |
| 6,413,392 | B1 | | 7/2002 | Sahoda et al. | |
| 2004/0251130 | A1 | * | 12/2004 | Liu et al. | 204/298.01 |
| 2006/0096857 | A1 | | 5/2006 | Lavitsky et al. | |

* cited by examiner

*Primary Examiner*—Rodney G McDonald
(74) *Attorney, Agent, or Firm*—Patterson & Sheridan, LLP

(57) ABSTRACT

The invention generally provides a ground shield for use in a physical vapor deposition (PVD) chamber. In one embodiment, a ground shield includes a generally cylindrical body comprising an outer wall, an inner upper wall, an inner lower wall having a diameter less than a diameter of the inner upper wall and a reentrant feature coupling the upper and inner lower walls. The reentrant feature advantageously prevents arching between the shield and target, which promotes greater process uniformity and repeatability along with longer chamber component service life.

18 Claims, 3 Drawing Sheets

GROUND SHIELD WITH REENTRANT FEATURE

BACKGROUND OF THE INVENTION

1. Field of the Invention

Embodiments of the invention generally relate to a ground shield for semiconductor processing chamber.

2. Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate pedestal disposed within the chamber.

A ground shield may be disposed in the chamber to help define a processing region in a desired region within the chamber with respect to the substrate. The ground shield helps confine the plasma within the processing region. Confining the plasma and the ejected atoms to the processing region helps maintain other components in the chamber free from deposited materials and promotes more efficient use of target materials, as a higher percentage of the ejected atoms are deposited on the substrate.

The ground shield (typically attached to the walls, or body, of the vacuum chamber) is electrically coupled to the vacuum chamber walls and is electrically isolated from the target. In addition, a small gap is maintained between the edge of the ground shield and the target to prevent the plasma from forming outside of the processing region. If enough material from the target is deposited on the ground shield during PVD processing, the deposited material may bridge the gap and the electrical isolation between the ground shield and target will be lost. The loss of electrical isolation will disrupt processing.

Therefore, there is a need in the art for an improved ground shield for use in a PVD chamber.

SUMMARY OF THE INVENTION

The invention generally provides a ground shield for use in a physical vapor deposition (PVD) chamber. In one embodiment, a ground shield includes a generally cylindrical body comprising an outer wall, an inner upper wall, an inner lower wall having a diameter less than a diameter of the inner upper wall and a reentrant feature coupling the upper and inner lower walls. The reentrant feature advantageously prevents arching between the shield and target, which promotes greater process uniformity and repeatability along with prolonging chamber component service life.

In another embodiment, a ground shield includes a generally cylindrical body having an outer wall, a mounting flange, upper and inner lower walls and a reentrant feature. The mounting flange extends outwards from the outer wall and has a plurality of radially orientated slots formed therein. The inner upper wall is flared outwards from the reentrant feature toward a top end of the body. The inner lower wall is defined at a bottom end of the body and has a diameter less than a diameter of the inner upper wall. The reentrant feature extends downwards and outward from the inner upper wall and couples to the inner lower wall.

DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The invention generally provides a ground shield for use in a physical vapor deposition (PVD) chamber. The ground shield advantageously prevents arching between the shield and target, which promotes greater process uniformity and repeatability along with longer chamber component service life.

Figure 1:
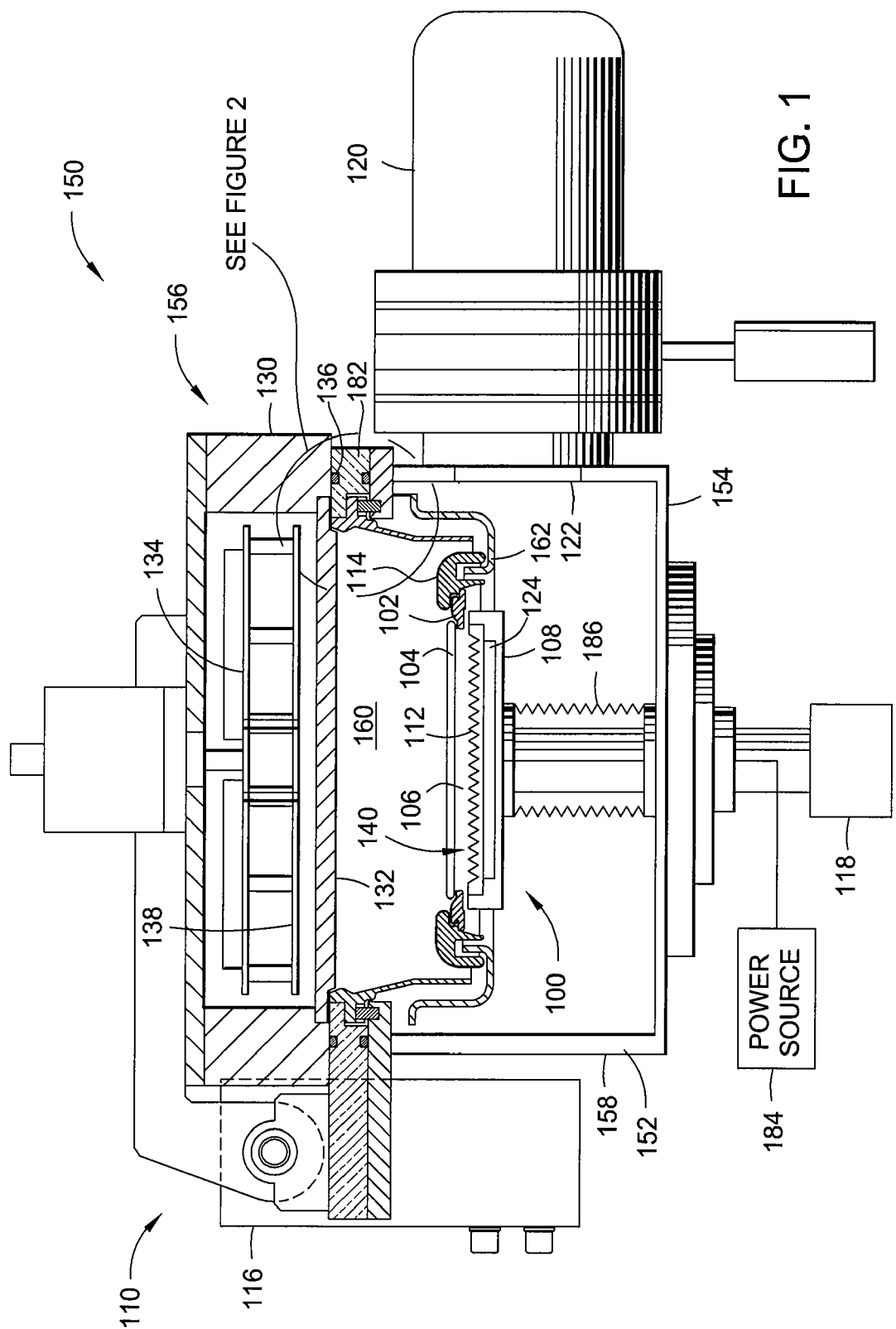
FIG. 1 is a simplified sectional view of a semiconductor processing system having one embodiment of a ground shield.

FIG. 1 depicts an exemplary semiconductor processing chamber 150 having one embodiment of a ground shield 180. One example of a processing chamber that may be adapted to benefit from the invention is an IMP VECTRA™ PVD processing chamber, available from Applied Materials, Inc., of Santa Clara, Calif. It is contemplated that other processing chambers, including those from other manufacturers, may be adapted to benefit from the invention.

The exemplary processing chamber 150 includes a chamber body 152 having a bottom 154, lid assembly 156 and sidewalls 158 that define an evacuable interior volume 160. The chamber body 150 is typically fabricated from welded plates of stainless steel or a unitary block of aluminum. The sidewalls 158 generally contain a sealable access port (not shown) to provide for entrance and egress of a substrate 104 from the processing chamber 150. A pumping port 122 disposed in the sidewalls 158 is coupled to a pumping system 120 that exhausts and controls the pressure of the interior volume 160. The lid assembly 156 of the chamber 150 generally supports an annular shield 162 suspended therefrom that supports a cover ring 114. The cover ring 114 is generally configured to confine deposition to a portion of the substrate 104 exposed through the center of the cover ring 114.

A pedestal assembly 100 is supported from the bottom 154 of the chamber 150. The pedestal assembly 100 supports a deposition ring 102 along with the substrate 104 during processing. The pedestal assembly 100 is coupled to the bottom 154 of the chamber 150 by a lift mechanism 118 that is configured to move the pedestal assembly 100 between an upper (as shown) and lower position. In the upper position, the pedestal assembly 100 engages the cover ring 114, lifting the cover ring 114 from the shield 162 as the pedestal assembly 100 moves the substrate 104 upwards to a processing position.

In the lower position, the pedestal assembly 100 is positioned below the shield 162 to allow the substrate 104 to be removed from the chamber 150 through the access port disposed in the sidewall 158. The shield 162 re-engages the cover ring 114 so that the ring 114 becomes suspended above the pedestal assembly 100 and substrate 104, as the pedestal assembly 100 moves to the lower position to facilitate substrate transfer below the shield 162. Additionally, in the lower position, lift pins (not shown) are moved through the pedestal assembly 100 to space the substrate 104 from the pedestal assembly 100 to facilitate securing of the substrate 104 by a wafer transfer mechanism disposed exterior to the processing chamber 150 such as a single blade robot (not shown). A bellows 186 is typically disposed between the pedestal assembly 100 and the chamber bottom 154 to isolate the interior volume 160 of the chamber body 152 from the interior of the pedestal assembly 100.

The pedestal assembly 100 generally includes a substrate support 140 sealingly coupled to a platform housing 108. The platform housing 108 is typically fabricated from a metallic material such as stainless steel or aluminum. A cooling plate 124 is generally disposed within the platform housing 108 to thermally regulate the substrate support 140. One pedestal assembly 100 that may be adapted to benefit from the invention is described in U.S. Pat. No. 5,507,499, issued Apr. 16, 1996 to Davenport et al., which is incorporated herein by reference in its entirety.

The substrate support 140 may be comprised of aluminum or ceramic. The substrate support 140 may be an electrostatic chuck, a ceramic body, a heater or a combination thereof. In one embodiment, the substrate support 140 is an electrostatic chuck that includes a dielectric body 106 having a conductive layer 112 embedded therein. The dielectric body 106 is typically fabricated from a high thermal conductivity dielectric material such as pyrolytic boron nitride, aluminum nitride, silicon nitride, alumina or an equivalent material. The dielectric body 106 allows the ground shield 180 to be electrically floating. Alternatively, the ground shield 180 may be electrically grounded.

The lid assembly 156 generally includes a lid 130, a target 132, spacer 182 and a magnetron 134. The lid 130 is supported by the sidewalls 158 when in a closed position, as shown in FIG. 1. Seals 136 are disposed between spacer 182 and the lid 130 and sidewalls 158 to prevent vacuum leakage therebetween.

The target 132 is coupled to the lid 130 and exposed to the interior volume 160 of the processing chamber 150. The target 132 provides material which is deposited on the substrate 104 during a PVD process. The spacer 182 is disposed between the target 132, lid 130 and chamber body 152 to electrically isolate the target 132 from the lid 130 and chamber body 152.

The target 132 and pedestal assembly 100 are biased relative to each other by a power source 184. A gas, such as argon, is supplied to the volume 160 from a gas source (not shown). A plasma is formed between the substrate 104 and the target 132 from the gas. Ions within the plasma are accelerated toward the target 132 and cause material to become dislodged from the target 132. The dislodged target material is deposited on the substrate 104.

The magnetron 134 is coupled to the lid 130 on the exterior of the processing chamber 150. The magnetron 134 includes at least one rotating magnet assembly 138 that promotes uniform consumption of the target 132 during the PVD process. One magnetron which may be utilized is described in U.S. Pat. No. 5,953,827, issued Sep. 21, 1999 to Or et al., which is hereby incorporated by reference in its entirety.

A hinge assembly 110 couples the lid assembly 156 to the processing chamber 150. A motorized actuator 116 may be coupled to the hinge assembly 110 and/or lid 130 to facilitate movement of the lid assembly 156 between an open and closed portion.

The ground shield 180 is disposed in the chamber volume 160 to help define a processing region between the substrate 104 and the target 132. The ground shield 180 has a generally cylindrical form that confines the plasma and atoms ejected from the target 132 within the processing region. The ground shield 180 additionally provides a barrier that prevents ejected material from the target 132 from inadvertently depositing on other portions of the chamber. As such, the ground shield 180 promotes efficient transformation of the target 132 into a material layer deposited on the substrate 104.

Figure 2:
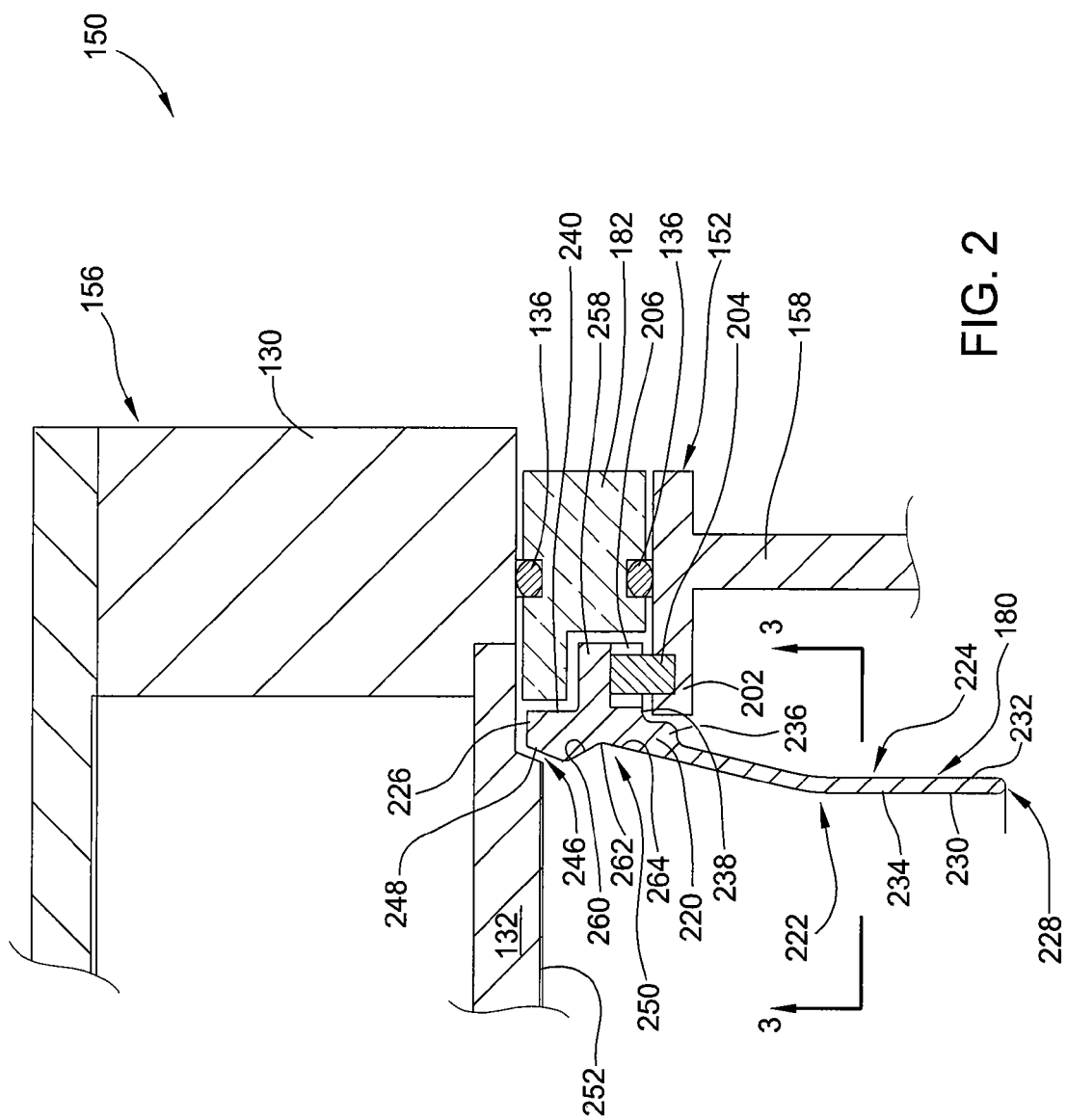
FIG. 2 is a partial sectional view of the ground shield of FIG. 1.

FIG. 2 is a partial sectional view of the processing system 150 illustrating a portion of the target 132, the chamber sidewall 158 and the ground shield 180. The chamber sidewall 158 includes an inwardly extending flange 202 that has a plurality of pins extending vertically therefrom for supporting the ground shield 180 thereon. Although one pin 204 is shown in the partial sectional view of FIG. 2, it is contemplated that at least three pins 204 may be utilized. Each pin 204 is engaged with a slot 206 formed in the ground shield 180. The length of the pins 204 and depth of the slots 206 are selected to maintain the ground shield 180 and flange 202 in a spaced apart relation. The slots 206 allow the ground shield 180 to slide over the pins 204, thereby accommodating thermal expansion and contraction of the ground shield 180 and/or chamber body 152.

The pins 204 are fabricated from and/or coated with a material selected to facilitate movement of the ground shield 180 over the pins 204 with minimal friction and particle generation. In one embodiment, the pins 204 are fabricated from and/or coated with a material that maintains electrical isolation between the ground shield 180 and flange 202. For example, the pins 204 may be fabricated from a dielectric material, such as ceramic. In another embodiment, the pins 204 may be coated with a polymer, for example, a fluoropolymer such as TEFLON® polymer.

The ground shield 180 has a substantially cylindrical body 220 and may be fabricated from and/or coated with a conductive material, such as metal. Metals suitable for use as the ground shield 180 include stainless steel and titanium, among others. The material selected for the ground shield 180 should be selected to be compatible with processes preformed within the chamber.

In one embodiment, the body 220 is defined by an inner wall 222, an outer wall 224, a top end 226 and a bottom end 228. Inner and outer lower portions 230, 232 of the inner wall 222 and the outer wall 224 located at the bottom end 228 of the body 220 define a containment ring 234. The inner lower portion 230 of the containment ring 234 extends below the target 132 into the process region to confine the plasma and sputtered materials as discussed above.

The outer lower portion 232 of the containment ring 234 extends from the bottom end 228 of the body 220 to one or more steps and a mounting flange 258. One step 236 is shown in FIG. 2. The mounting flange 258 includes a downwardly facing support surface 238.

Figure 3:
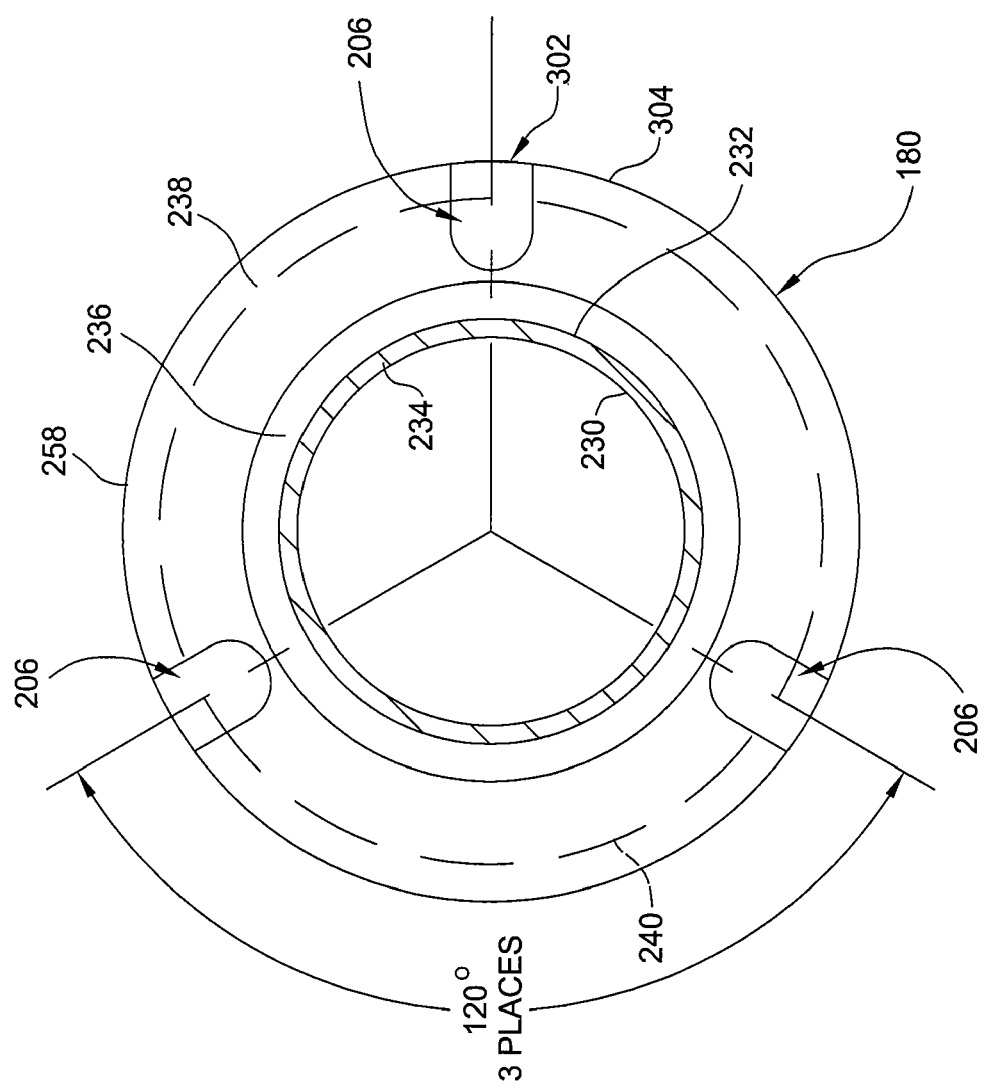
FIG. 3 is another sectional view of the ground shield taken through section line 3-3 of FIG. 2.

Referring additionally to FIG. 3, the slot 206 is formed in the support surface 238. The support surface 238 is dimensioned to provide space for the slot 206 to have a length adequate to allow the pin 206 to slide within the slot as the ground shield 180 and chamber body 152 expand and contract relative to each other. The slot 206 has a radial orientation relative to a center line of the ground shield 180, such that the ground shield 180 and chamber body 152 may expand and contract relative to each other without binding and with minimal particle generation. In the embodiment depicted in FIG. 3, the slot 206 has an outer end 302 open through an outside wall 304 of the mounting flange 258.

In one embodiment, the slots 206 are configured such that the inner end of the slots 206 abuts, or is very close to, the pins 204 when the ground shield 180 is set in the chamber body 152 at substantially room temperature. Since all pins 204 abut the inner edge of the slots 206 upon installation of the ground shield 180, the ground shield 180 is effectively centered in the chamber body 152 around the pedestal assembly 100. Thus, as the ground shield 180 and chamber body 152 increase in temperature during processing, the pins 204 are free to travel outward in the slots 206 since the chamber body 152 expands relative to the ground shield 180. Moreover, since the ground shield 180 and chamber body 152 expend relative to the center of the chamber, the ground shield 180 remains concentrically positioned over the pedestal assembly 100 after heating.

The outer wall 224 includes an upper portion 240 of the outer wall 224. The diameter of the outer upper portion 240 of the outer wall 224 is greater than a diameter of the outer lower portion 232 and less than a diameter of the outside wall 304. Referring back to FIG. 2, the inner wall 222 includes an inner upper portion 248 defined at the top end 226. The diameter of the inner upper portion 248 of the inner wall 222 is greater than a diameter of the inner lower portion 230.

The inner upper portion 248 faces the target 132. The inner upper portion 248 has a diameter selected to allow a gap 246 to be maintained between the target 132 and the ground shield 180. In one embodiment, the inner upper portion 248 is flared outwards toward the top end 226 of the body 220.

A reentrant feature 250 is formed between the inner upper portion 248 and the inner lower portion 230 of the inner wall 222. The reentrant feature 250 generally extends outward (i.e., has a greater diameter than) the inner wall 222. The ground shield 180 is configured such that the reentrant feature 250 begins approximately at a bottom surface 252 of the target 132. Since the reentrant feature 250 extends away from the target 132, material being sputtered from the bottom surface 252 of the target 132 is less likely to deposit on an area of the ground shield 180 proximate the target 132. Thus, deposited material is unlikely to form a bridge between the target 132 and ground shield 180, thereby preventing arcing, shorting or other problem which may affect the performance of processes preformed in the chamber 150.

In the embodiment depicted in FIG. 2, the reentrant feature 250 includes an upper section 260 that extends downward and outward from the inner upper portion 248. The upper section 260 is joined to a lower section 264 at a trough 262. In one embodiment, the trough 262 has a generally curved profile. The trough 262 generally has a diameter greater than the diameter of the adjacent portion of the inner upper portion 248 of the inner wall 222. The lower section 264 of the reentrant feature 250 extends downward and inward from the trough 262 to the inner lower portion 230 of the inner wall 222.

It is contemplated that the reentrant feature 250 may alternatively be a slot, groove or recess formed in the body 220 that has a diameter greater than the diameter of the adjacent portion of the inner upper portion 248 of the inner wall 222. It is also contemplated that the reentrant feature 250 may have any other geometric suitable geometry consistent with the teachings herein.

Some portions of the ground shield 180 may be coated, textured or otherwise treated. In one embodiment, the ground shield 180 is roughened on at least some surfaces. Roughening may be accomplished by etching, embossing, abrading, bead blasting, grit blasting, grinding or sanding, among other suitable processes. In the embodiment depicted in FIG. 2, all surfaces of the ground shield 180 are bead blasted except for the slots 206. The bead blasted surfaces of the ground shield generally have an RA surface finish of about 250 or greater microinches.

Thus, a ground shield has been provided that includes a reentrant feature on its inner surface. The reentrant ground shield facilitates substrate deposition processes with reduced processing defects due to shorting and/or material bridging between the ground shield and target.

While the foregoing is directed to the preferred embodiment of the present invention, other and further embodiments of the invention may be devised without departing from the basic scope thereof, and the scope thereof is determined by the claims that follow.

What is claimed is:

1. A ground shield for use in a chamber, the ground shield comprising:
   a generally cylindrical body comprising:
      an outer wall;
      an inner upper wall;
      an inner lower wall having a diameter less than a diameter of the inner upper wall; and
      a reentrant feature coupling the upper and inner lower walls, the reentrant feature including an upper section that extends downward and outward from the inner upper wall to a trough, such that a diameter of the reentrant feature adjacent to the inner upper wall and approximately at a bottom surface of a target in the chamber, is less than the diameter of the inner upper wall, while the diameter of the trough is greater than the diameter of the reentrant feature adjacent to the inner upper wall.

2. The ground shield of claim 1, wherein the body is fabricated from stainless steel.

3. The ground shield of claim 1, wherein the body is fabricated from titanium.

4. The ground shield of claim 1, wherein the body is fabricated from or coated with a conductive material.

5. The ground shield of claim 1, wherein at least a portion of the body has a surface treatment.

6. The ground shield of claim 1, wherein at least a portion of the body has a bead blasted surface.

7. The ground shield of claim 1 further comprising:
   a mounting flange extending from the outer wall.

8. The ground shield of claim 7, wherein the mounting flange further comprises:
   a plurality of slots formed therein.

9. The ground shield of claim 8, wherein the body has a bead blasted surface except for the slots.

10. The ground shield of claim 8, wherein the slots are arranged in a polar array.

11. The ground shield of claim 9, wherein the slots have an end open through an outside wall of the flange.

12. The ground shield of claim 9, wherein the slots are orientated radially relative to a centerline of the body.

13. The ground shield of claim 1, wherein the inner upper wall is flared outward.

14. The ground shield of claim 1 further comprising:
   a plurality of slots formed on a side of the ground shield opposite the reentrant feature.

15. A ground shield for use in a chamber, the ground shield comprising:
   a generally cylindrical body comprising:
   an outer wall;
   a mounting flange extending from the outer wall and having a plurality of radially orientated slots formed therein;
   an inner upper wall flared outwards toward a top end of the body;
   an inner lower wall defined at a bottom end of the body and having a diameter less than a diameter of the inner upper wall; and
   a reentrant feature coupling the upper and inner lower walls, the reentrant feature including an upper section that extends downwards and outward from the inner upper wall to a trough, such that a diameter of the reentrant feature adjacent to the inner upper wall and approximately at a bottom surface of a target in the chamber, is less than the diameter of the inner upper wall, while the diameter of the trough is greater than the diameter of the reentrant feature adjacent to the inner upper wall.

16. The ground shield of claim 15, wherein at least a portion of the body has a bead blasted surface.

17. The ground shield of claim 15, wherein the body comprises at least one of stainless steel or titanium.

18. A ground shield for use in a chamber, the ground shield comprising:
   a generally cylindrical stainless steel body comprising:
   an outer wall;
   an inner wall having upper and lower portions, the upper portion of the inner wall flared outwards toward a top end of the body and having a diameter greater than a diameter of the lower portion;
   a mounting flange extending from the outer wall to outside wall and having a support surface facing a bottom end of the body;
   a plurality of slots arranged in a polar array and formed in the support surface, the slots having an open end extending through the outside wall of the mounting flange; and
   a reentrant feature including:
      an upper section that extends downwards and outward from the upper portion of the inner wall to a trough, such that a diameter of the reentrant feature adjacent to the inner upper wall and approximately at a bottom surface of a target in the chamber, is less than the diameter of the inner upper wall, while the diameter of the trough is greater than the diameter of the reentrant feature adjacent to the inner upper wall; and
      a lower section that extends upwards and outwards from the lower portion of the inner wall to the trough.

* * * * *